(12) United States Patent
Lee

(10) Patent No.: US 9,478,260 B2
(45) Date of Patent: Oct. 25, 2016

(54) SEMICONDUCTOR DEVICE AND SEMICONDUCTOR SYSTEM

(71) Applicant: SK hynix Inc., Icheon-si Gyeonggi-do (KR)

(72) Inventor: Myung Hwan Lee, Cheonan-si (KR)

(73) Assignee: SK HYNIX INC., Icheon-Si (KR)

( * ) Notice: Subject to any disclaimer, the term of this patent is extended or adjusted under 35 U.S.C. 154(b) by 15 days.

(21) Appl. No.: 14/723,592

(22) Filed: May 28, 2015

(65) Prior Publication Data

US 2016/0254033 A1    Sep. 1, 2016

(30) Foreign Application Priority Data

Feb. 26, 2015  (KR) .................. 10-2015-0027588

(51) Int. Cl.
*G11C 5/14*  (2006.01)

(52) U.S. Cl.
CPC .................. *G11C 5/147* (2013.01)

(58) Field of Classification Search
CPC ..................................... G11C 5/14
USPC .......... 365/200, 201, 185.02, 185.2, 185.09, 365/226, 228, 154
See application file for complete search history.

(56) References Cited

U.S. PATENT DOCUMENTS

| 5,844,913 | A | * | 12/1998 | Hassoun | .......... | G01R 31/31924 |
| | | | | | | 324/537 |
| 6,166,990 | A | * | 12/2000 | Ooishi | .................... | G11C 7/22 |
| | | | | | | 365/194 |
| 7,508,332 | B2 | * | 3/2009 | Jeong | .................... | G01K 7/015 |
| | | | | | | 341/155 |
| 8,140,293 | B2 | * | 3/2012 | Jeong | .................... | G01K 7/425 |
| | | | | | | 702/117 |
| 8,395,958 | B2 | * | 3/2013 | Resnick | .......... | G01R 19/16552 |
| | | | | | | 365/189.07 |
| 2008/0106451 | A1 | * | 5/2008 | Jeong | .................... | G01K 7/015 |
| | | | | | | 341/155 |
| 2011/0316512 | A1 | | 12/2011 | Tanzawa | | |
| 2012/0176847 | A1 | * | 7/2012 | Resnick | .......... | G01R 19/16552 |
| | | | | | | 365/189.07 |
| 2013/0188430 | A1 | * | 7/2013 | Resnick | .......... | G01R 19/16552 |
| | | | | | | 365/189.07 |

FOREIGN PATENT DOCUMENTS

KR           101083682 B1    11/2011

\* cited by examiner

*Primary Examiner* — Harry W Byrne
(74) *Attorney, Agent, or Firm* — William Park & Associates Ltd.

(57) ABSTRACT

A semiconductor device may include a target voltage generation section configured to generate first and second target voltages. The semiconductor device may include a comparison signal generation section configured to compare levels of the first and second target voltages with levels of first and second internal voltages, and generate first and second comparison signals. The semiconductor device may include a latch code generation section configured to latch global codes and output first and second latch codes in response to the first and second comparison signals. The semiconductor device may include a selection code generation section configured to generate first and second selection codes for adjusting levels of the first and second internal voltages using either the global codes or the first and second latch codes.

20 Claims, 10 Drawing Sheets

FIG.7

| GC<1:2> | VINT1 | VINT2 |
|---|---|---|
| '00' | LEV1 | LEV5 |
| '01' | LEV2 | LEV6 |
| '10' | LEV3 | LEV7 |
| '11' | LEV4 | LEV8 |

LEV1<TV1<LEV2<LEV3<LEV4
LEV5<LEV6<TV2<LEV7<LEV8

FIG.9

| GC<1:2> | VINT1 | VINT2 |
|---------|-------|-------|
| '11'    | LEV4  | LEV8  |
| '10'    | LEV3  | LEV7  |
| '01'    | LEV2  | LEV6  |
| '00'    | LEV1  | LEV5  |

LEV4<LEV3<TV1<LEV2<LEV1
LEV8<TV2<LEV7<LEV6<LEV5

SEMICONDUCTOR DEVICE AND SEMICONDUCTOR SYSTEM

CROSS-REFERENCE TO RELATED APPLICATION

The present application claims priority under 35 U.S.C. §119(a) to Korean application number 10-2015-0027588, filed on Feb. 26, 2015, in the Korean Intellectual Property Office, which is incorporated herein by reference in its entirety.

BACKGROUND

1. Technical Field

Embodiments of the present disclosure may generally relate to a semiconductor device and a semiconductor system and, more particularly, to adjusting the levels of a plurality of internal voltages of the semiconductor device and/or semiconductor system.

2. Related Art

A semiconductor memory device may receive a power supply voltage VDD and a ground voltage VSS from an exterior. The semiconductor memory device may generate and use internal voltages required for internal operations thereof. The voltages required for the internal operations of the semiconductor memory device may include a core voltage VCORE, a high voltage VPP, and a back-bias voltage VBB. The core voltage VCORE may be supplied to a memory core area. The high voltage VPP may be used in the driving or over-driving of a word line. The back-bias voltage VBB may be supplied as a bulk voltage of a NMOS transistor of the core area.

Since the core voltage VCORE is supplied by reducing the power supply voltage VDD inputted from the exterior to a predetermined voltage, but the high voltage VPP has a voltage with a level higher than that of the power supply voltage VDD inputted from the exterior and the back-bias voltage VBB substantially maintains a voltage with a level lower than that of the ground voltage VSS inputted from the exterior, a charge pump circuit for supplying charge for the high voltage VPP and the back-bias voltage VBB is required in order to supply the high voltage VPP and the back-bias voltage VBB.

SUMMARY

In an embodiment, there may be provided a semiconductor system. The semiconductor system may include a controller configured to output an upper limit voltage, a lower limit voltage, a test mode enable signal, and global codes. The semiconductor system may include a semiconductor device configured to generate first and second target voltages in response to the upper limit voltage and the lower limit voltage. The semiconductor system may include a semiconductor device configured to generate first and second latch codes from the global codes in response to the first and second target voltages. The semiconductor system may include a semiconductor device configured to generate first and second selection codes for adjusting levels of first and second internal voltages using either the global codes or the first and second latch codes.

In an embodiment, there may be provided a semiconductor device. The semiconductor device may include a target voltage generation section configured to generate first and second target voltages in response to an upper limit voltage and a lower limit voltage inputted from pads. The semiconductor device may include a comparison signal generation section configured to compare levels of the first and second target voltages with levels of first and second internal voltages, and generate first and second comparison signals. The semiconductor device may include a latch code generation section configured to latch global codes and output first and second latch codes in response to the first and second comparison signals. The semiconductor device may include a selection code generation section configured to generate first and second selection codes for adjusting levels of the first and second internal voltages using either the global codes or the first and second latch codes.

BRIEF DESCRIPTION OF THE DRAWINGS

FIGS. 6 to 9 are representations of examples of diagrams for explaining an internal voltage trimming operation of a semiconductor system illustrated in FIG. 1 to FIG. 5.

DETAILED DESCRIPTION

Hereinafter, semiconductor devices and semiconductor systems will be described below with reference to the accompanying drawings through various examples of embodiments.

In accordance with an embodiment, target voltages may be generated using an upper limit voltage and a lower limit voltage applied from an exterior through pads, and global codes may be latched through comparison signals obtained by comparing the levels of the target voltages with the levels of a plurality of internal voltages, so that it may be possible to easily adjust the levels of the plurality of internal voltages.

Figure 1:
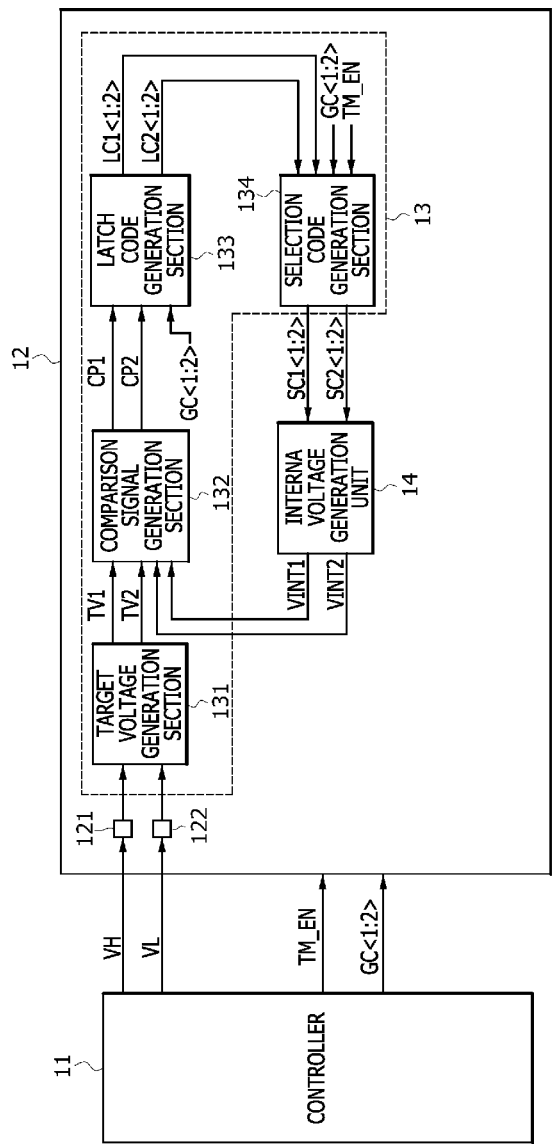
FIG. 1 is a block diagram illustrating a representation of an example of a configuration of a semiconductor system in accordance with an embodiment.

Referring to FIG. 1, a semiconductor system in accordance with an embodiment may include a controller 11 and a semiconductor device 12. The controller 11 may apply an upper limit voltage VH, and a lower limit voltage VL to the semiconductor device. The controller 11 may apply a test mode enable signal TM_EN, and global codes GC<1:2> to the semiconductor device 12. The semiconductor device 1 may include a trimming control unit 13 and an internal voltage generation unit 14. The trimming control unit 13 may include a target voltage generation section 131, a comparison signal generation section 132, a latch code generation section 133, and a selection code generation section 134.

The target voltage generation section 131 may receive the upper limit voltage VH through a first pad 121. The target voltage generation section 131 may receive the lower limit voltage VL through a second pad 122. The target voltage generation section 131 may generate a first target voltage TV1 and a second target voltage TV2. The target voltage generation section 131 may generate the first target voltage TV1 and the second target voltage TV2 including levels adjusted according to the levels of the upper limit voltage VH and the lower limit voltage VL. Configurations and operations of the target voltage generation section 131 will be described later with reference to FIG. 2.

The comparison signal generation section 132 may compare the levels of the first target voltage TV1 and a first internal voltage VINT1 with each other. The comparison signal generation section 132 may generate a first comparison signal CP1. The comparison signal generation section 132 may compare the levels of the second target voltage TV2 and a second internal voltage VINT2 with each other. The comparison signal generation section 132 may generate a second comparison signal CP2. Configurations and operations of the comparison signal generation section 132 will be described later with reference to FIG. 3.

The latch code generation section 133 may latch the global codes GC<1:2> in response to the first comparison signal CP1 and may output first latch codes LC1<1:2>. The latch code generation section 133 may latch the global codes GC<1:2> in response to the second comparison signal CP2 and may output second latch codes LC2<1:2>. Configurations and operations of the latch code generation section 133 will be described later with reference to FIG. 4.

The selection code generation section 134 may output the global codes GC<1:2> or the first latch codes LC1<1:2> as first selection codes SC1<1:2> in response to the test mode enable signal TM_EN. The selection code generation section 134 may output the global codes GC<1:2> or the second latch codes LC2<1:2> as second selection codes SC2<1:2> in response to the test mode enable signal TM_EN. Configurations and operations of the selection code generation section 134 will be described later with reference to FIG. 5.

The internal voltage generation unit 14 may generate the first internal voltage VINT1 with a level adjusted according to the first selection codes SC1<1:2>. The internal voltage generation unit 14 may generate the second internal voltage VINT2 with a level adjusted according to the second selection codes SC2<1:2>. For example, when the first selection codes SC1<1:2> are up-counted to '00', '01', '10', and '11' by one bit, the level of the first internal voltage VINT1 may be set to linearly increase and decrease. The '01' of the first selection codes SC1<1:2> indicates that SC1<1> is at a logic high level and SC1<2> is at a logic low level. The levels of the first internal voltage VINT1 and the second internal voltage VINT2 set according to a combination of the levels of the first selection codes SC1<1:2> and the second selection codes SC2<1:2> may be variously set according to the various embodiments. The first internal voltage VINT1 and the second internal voltage VINT2 may be set as internal voltages generated in the semiconductor device 12, for example, a core voltage VCORE, a high voltage VPP, a back-bias voltage VBB and the like.

Figure 2:
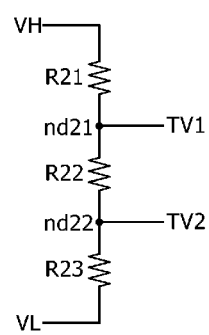
FIG. 2 is a diagram illustrating a representation of an example of a configuration in accordance with an embodiment of a target voltage generation section included in a semiconductor system illustrated in FIG. 1.

Referring to FIG. 2, the target voltage generation section 131 may include, for example, resistive elements R21 to R23. The resistive element R21 may be coupled between the upper limit voltage VH and a node nd21. The resistive element R22 may be coupled between the node nd21 and a node nd22. The resistive element R23 may be coupled between the node nd22 and the lower limit voltage VL. The target voltage generation section 131 performs voltage divisions according to resistance values of the resistive elements R21 to R23, thereby outputting the first target voltage TV1 to the node nd21 and outputting the second target voltage TV2 to the node nd22. The first target voltage TV1 is $$\frac{(R22 + R23)VH \times R21VL}{(R21 + R22 + R23)}$$

and the second target voltage TV2 is $$\frac{R23VH \times (R21 + R22)VL}{(R21 + R22 + R23)}.$$

The levels of the first target voltage TV1 and the second target voltage TV2 increase as the level of the upper limit voltage VH or the lower limit voltage VL increases.

Figure 3:
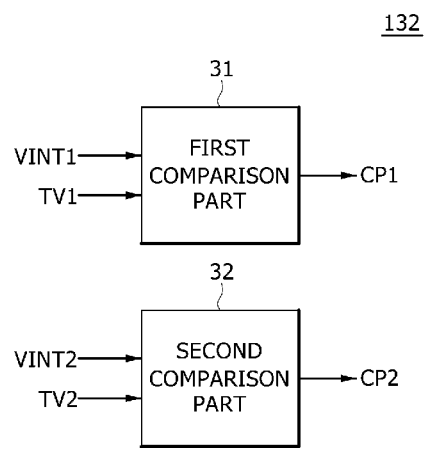
FIG. 3 is a diagram illustrating a representation of an example of a configuration in accordance with an embodiment of a comparison signal generation section included in a semiconductor system illustrated in FIG. 1.

Referring to FIG. 3, the comparison signal generation section 132 may include a first comparison part 31 and a second comparison part 32. The first comparison part 31 may generate the first comparison signal CP1 at a logic low level when, for example, the level of the first internal voltage VINT1 is lower than that of the first target voltage TV1. The first comparison part 31 may generate the first comparison signal CP1 at a logic high level when, for example, the level of the first internal voltage VINT1 is higher than that of the first target voltage TV1. The logic level of the first comparison signal CP1 based on the comparison of the first target voltage TV1 and the first internal voltage VINT1 may be variously set according to embodiments. The second comparison part 32 may generate the second comparison signal CP2 at a logic low level when, for example, the level of the second internal voltage VINT2 is lower than that of the second target voltage TV2. The second comparison part 32 may generate the second comparison signal CP2 at a logic high level when, for example, the level of the second internal voltage VINT2 is higher than that of the second target voltage TV2. The logic level of the second comparison signal CP2 based on the comparison of the second target voltage TV2 and the second internal voltage VINT2 may be variously set according to embodiments.

Figure 4:
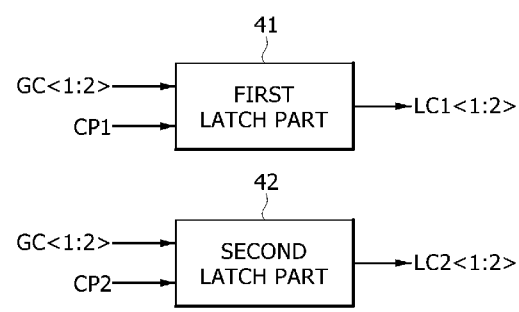
FIG. 4 is a diagram illustrating a representation of an example of a configuration in accordance with an embodiment of a latch code generation section included in a semiconductor system illustrated in FIG. 1.

Referring to FIG. 4, the latch code generation section 133 may include a first latch part 41 and a second latch part 42. The first latch part 41 may latch the global codes GC<1:2> and output the first latch codes LC1<1:2> when, for example, the first comparison signal CP1 is transitioned from a logic low level to a logic high level. According to various embodiments, the first latch part 41 may also latch the global codes GC<1:2> and output the first latch codes LC1<1:2> when, for example, the first comparison signal CP1 is transitioned from a logic high level to a logic low level. The second latch part 42 may latch the global codes GC<1:2> and output the second latch codes LC2<1:2> when, for example, the second comparison signal CP2 is transitioned from a logic low level to a logic high level. According to various embodiments, the second latch part 42 may also latch the global codes GC<1:2> and output the second latch codes LC2<1:2> when, for example, the second comparison signal CP2 is transitioned from a logic high level to a logic low level.

Figure 5:
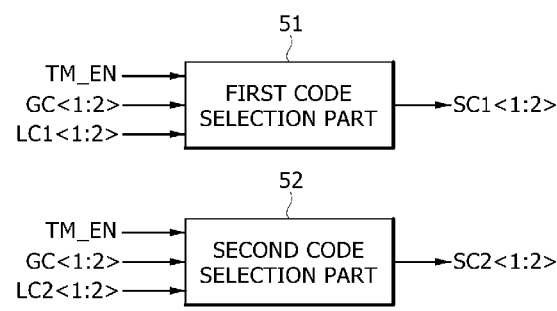
FIG. 5 is a diagram illustrating a representation of an example of a configuration in accordance with an embodiment of a selection code generation section included in a semiconductor system illustrated in FIG. 1.

Referring to FIG. 5, the selection code generation section 134 may include a first code selection part 51 and a second code selection part 52. The first code selection part 51 may output the global codes GC<1:2> as the first selection codes SC1<1:2>. The first code selection part 51 may output the global codes GC<1:2> as the first selection codes SC1<1:2> when, for example, the test mode enable signal TM_EN is enabled. The first code selection part 51 may output the first latch codes LC1<1:2> as the first selection codes SC1<1:2>. The first code selection part 51 may output the first latch codes LC1<1:2> as the first selection codes SC1<1:2> when, for example, the test mode enable signal TM_EN is disabled. For example, the test mode enable signal TM_EN may be set to be enabled for a period in which a test for adjusting the levels of the first internal voltage VINT1 and the second internal voltage VINT2 by applying the counted global codes GC<1:2> is being performed. A level at which the test mode enable signal TM_EN is enabled may be variously set according to the various embodiments. The second code selection part 52 may output the global codes GC<1:2> as the second selection codes SC2<1:2>. The second code selection part 52 may output the global codes GC<1:2> as the second selection codes SC2<1:2> when, for example, the test mode enable signal TM_EN is enabled. The second code selection part 52 may output the second latch codes LC2<1:2> as the second selection codes SC2<1:2>. The second code selection part 52 may output the second latch codes LC2<1:2> as the second selection codes SC2<1:2> when, for example, the test mode enable signal TM_EN is disabled.

Figure 6:
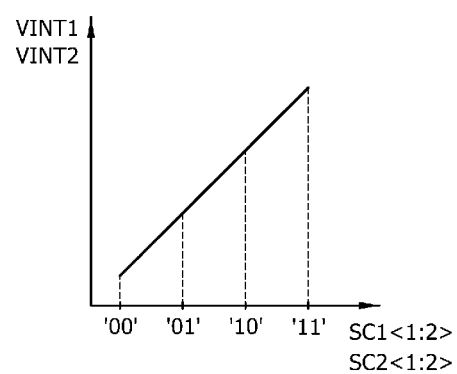

Hereinafter, an example of an operation in which the levels of the first internal voltage VINT1 and the second internal voltage VINT2 are adjusted will be described with reference to FIG. 7 on the assumption that the levels of the first internal voltage VINT1 and the second internal voltage VINT2 linearly increase as the level combinations of the first selection codes SC1<1:2> and the second selection codes SC2<1:2> are up-counted to '00', '01', '10', and '11' by one bit as illustrated in FIG. 6.

Referring to FIG. 7, in the state in which, for example, the controller 11 applies the enabled test mode enable signal TM_EN to the semiconductor device 12, when the global codes GC<1:2> up-counted to '00', '01', '10', and '11' by one bit are applied, the first selection codes SC1<1:2> and the second selection codes SC2<1:2> are generated at substantially the same level combinations as those of the global codes GC<1:2>. As the first selection codes SC1<1:2> are up-counted to '00', '01', '10', and '11' by one bit, the level of the first internal voltage VINT1 is sequentially adjusted to 'LEV1', 'LEV2', 'LEV3', and 'LEV4'. As the second selection codes SC2<1:2> are up-counted to '00', '01', '10', and '11' by one bit, the level of second internal voltage VINT2 is sequentially adjusted to 'LEV5', 'LEVE', 'LEV7', and 'LEV8'. Since the first target voltage TV1 has a level between 'LEV1' and 'LEV2', when the first selection codes SC1<1:2> are set to '01' and the first internal voltage VINT1 is generated to 'LEV2', the first comparison signal CP1 is transitioned from a logic low level to a logic high level. In this example, the first latch codes LC1<1:2> are latched to '01' for output. Since the second target voltage TV2 has a level between 'LEVE' and 'LEV7', when the second selection codes SC2<1:2> are set to '10' and the second internal voltage VINT2 is generated to 'LEV7', the second comparison signal CP2 is transitioned from a logic low level to a logic high level. In this example, the second latch codes LC2<1:2> are latched to '10' for output. When the test is ended and the test mode enable signal TM_EN is disabled, the first latch codes LC1<1:2> set to '01' are transferred as the first selection codes SC1<1:2> and the first internal voltage VINT1 is generated to 'LEV2'. In the state in which the test mode enable signal TM_EN has been disabled, the second latch codes LC2<1:2> set to '10' are transferred as the second selection codes SC2<1:2> and the second internal voltage VINT2 is generated to 'LEV7'.

Figure 8:
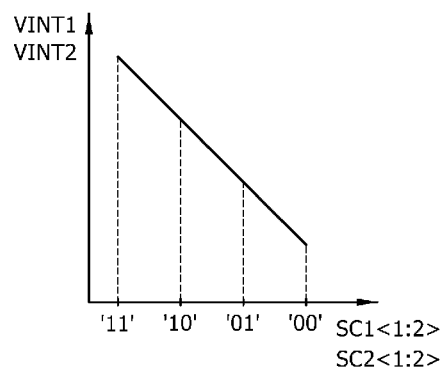

Hereinafter, an example of an operation in which the levels of the first internal voltage VINT1 and the second internal voltage VINT2 are adjusted will be described with reference to FIG. 9 on the assumption that the levels of the first internal voltage VINT1 and the second internal voltage VINT2 linearly decrease as the level combinations of the first selection codes SC1<1:2> and the second selection codes SC2<1:2> are down-counted to '11', '10', '01', and '00' by one bit as illustrated in FIG. 8.

Referring to FIG. 9, in the state in which, for example, the controller 11 applies the enabled test mode enable signal TM_EN to the semiconductor device 12, when the global codes GC<1:2> down-counted to '11', '10', '01', and '00' by one bit are applied, the first selection codes SC1<1:2> and the second selection codes SC2<1:2> are generated at substantially the same level combinations as those of the global codes GC<1:2>. As the first selection codes SC1<1:2> are down-counted to '11', '10', '01', and '00' by one bit, the level of the first internal voltage VINT1 is sequentially adjusted to 'LEV4', 'LEV3', 'LEV2', and 'LEV1'. As the second selection codes SC2<1:2> are down-counted to '11', '10', '01', and '00' by one bit, the level of second internal voltage VINT2 is sequentially adjusted to 'LEV8', 'LEV7', 'LEVE', and 'LEV5'. Since the first target voltage TV1 has a level between 'LEV3' and 'LEV2', when the first selection codes SC1<1:2> are set to '01' and the first internal voltage VINT1 is generated to 'LEV2', the first comparison signal CP1 is transitioned from a logic low level to a logic high level. In this example, the first latch codes LC1<1:2> are latched to '01' for output. Since the second target voltage TV2 has a level between 'LEV8' and 'LEV7', when the second selection codes SC2<1:2> are set to '10' and the second internal voltage VINT2 is generated to 'LEV7', the second comparison signal CP2 is transitioned from a logic low level to a logic high level. In this example, the second latch codes LC2<1:2> are latched to '10' for output. When the test is ended and the test mode enable signal TM_EN is disabled, the first latch codes LC1<1:2> set to '01' are transferred as the first selection codes SC1<1:2> and the first internal voltage VINT1 is generated to 'LEV2'. In the state in which the test mode enable signal TM_EN has been disabled, the second latch codes LC2<1:2> set to '10' are transferred as the second selection codes SC2<1:2> and the second internal voltage VINT2 is generated to 'LEV7'.

For example, in the semiconductor system in accordance with an embodiment, the controller 11 may apply the sequentially up-counted or down-counted global codes GC<1:2> to the semiconductor device 12, and the semiconductor device 12 may sequentially adjust the levels of the first and second internal voltages VINT1 and VINT2 according to the global codes GC<1:2> in response to the first target voltage TV1 and the second target voltage TV2 generated by the upper limit voltage VH and the lower limit voltage VL. For example, in the semiconductor system in accordance with an embodiment, it may be possible to simultaneously adjust a plurality of internal voltages by using the global codes GC<1:2>.

Figure 10:
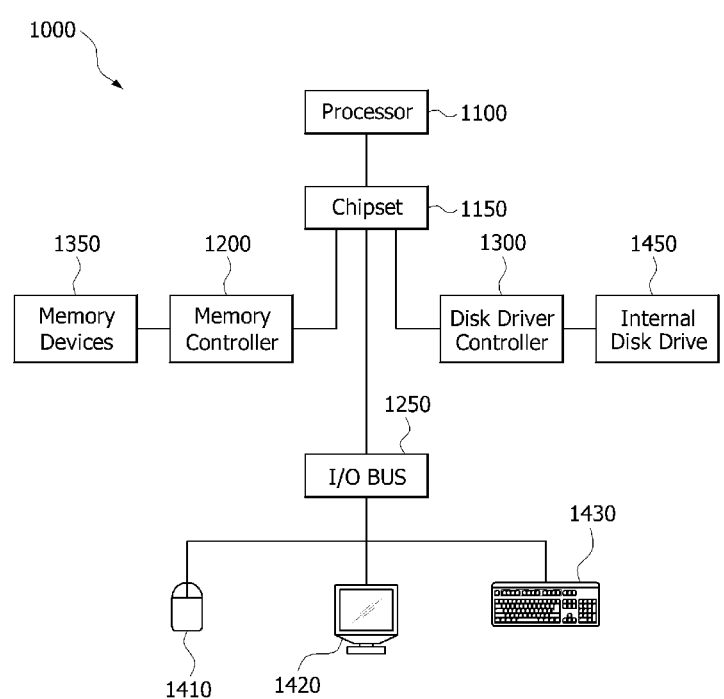
FIG. 10 illustrates a block diagram of an example of a representation of a system employing a semiconductor system and/or semiconductor device in accordance with the various embodiments discussed above with relation to FIGS. 1-9.

The semiconductor system and/or semiconductor device discussed above (see FIGS. 1-9) are particular useful in the design of memory devices, processors, and computer systems. For example, referring to FIG. 10, a block diagram of a system employing the semiconductor system and/or semiconductor device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor system and/or semiconductor device as discussed above with reference to FIGS. 1-9. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor system and/or semiconductor device as discussed above with relation to FIGS. 1-9, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 10 is merely one example of a system employing the semiconductor system and/or semiconductor device as discussed above with relation to FIGS. 1-9. In alternate embodiments, such as cellular phones or digital cameras, the components may differ from the embodiments illustrated in FIG. 10.

While various embodiments have been described above, it will be understood to those skilled in the art that the embodiments described are by way of example only. Accordingly, the semiconductor device and the semiconductor system described herein should not be limited based on the described embodiments.

What is claimed is:

1. A semiconductor system comprising:
   a controller configured to output an upper limit voltage, a lower limit voltage, a test mode enable signal, and global codes;
   a semiconductor device configured to generate first and second target voltages in response to the upper limit voltage and the lower limit voltage, generate first and second latch codes from the global codes in response to the first and second target voltages, and generate first and second selection codes for adjusting levels of first and second internal voltages using either the global codes or the first and second latch codes.

2. The semiconductor system of claim 1, wherein the global codes are up-counted or down-counted by one bit in a state in which the test mode enable signal has been enabled.

3. The semiconductor system of claim 1, wherein the upper limit voltage is set to a level higher than a level of the lower limit voltage, and the first and second target voltages are set to levels between the upper limit voltage and the lower limit voltage.

4. The semiconductor system of claim 1, wherein the semiconductor device comprises:
   a first resistive element configured to be coupled between the upper limit voltage and a first node where the first target voltage is outputted;
   a second resistive element configured to be coupled between the first node and a second node where the second target voltage is outputted; and
   a third resistive element configured to be coupled between the second node and the lower limit voltage.

5. The semiconductor system of claim 1, wherein the semiconductor device comprises:
   a comparison signal generation section configured to compare levels of the first and second target voltages with the levels of the first and second internal voltages, and generate first and second comparison signals; and
   a latch code generation section configured to latch the global codes and output the first and second latch codes in response to the first and second comparison signals.

6. The semiconductor system of claim 5, wherein the comparison signal generation section comprises:
   a first comparison part configured to compare the level of the first target voltage with the level of the first internal voltage, and generate the first comparison signal; and
   a second comparison part configured to compare the level of the second target voltage with the level of the second internal voltage, and generate the second comparison signal.

7. The semiconductor system of claim 5, wherein the latch code generation section comprises:
   a first latch part configured to latch the global codes and output the first latch code in response to the first comparison signal; and
   a second latch part configured to latch the global codes and output the second latch code in response to the second comparison signal.

8. The semiconductor system of claim 1, wherein the semiconductor device comprises:
a selection code generation section configured to output the global codes as the first and second selection codes when the test mode enable signal is enabled, and output the first and second latch codes as the first and second selection codes when the test mode enable signal is disabled.

9. The semiconductor system of claim 1, wherein the semiconductor device comprises:
an internal voltage generation unit configured to generate the first internal voltage including a level, the level of the first internal voltage adjusted according to a level combination of the first selection code, and generate the second internal voltage including a level, the level of the second internal voltage adjusted according to a level combination of the second selection code.

10. The semiconductor system of claim 9, wherein the level of the first internal voltage increases when the first selection code is counted by one bit, and the level of the second internal voltage linearly increases when the second selection code is counted by one bit.

11. The semiconductor system of claim 9, wherein the level of the first internal voltage decreases when the first selection code is counted by one bit, and the level of the second internal voltage linearly decreases when the second selection code is counted by one bit.

12. A semiconductor device comprising:
a target voltage generation section configured to generate first and second target voltages in response to an upper limit voltage and a lower limit voltage received from pads;
a comparison signal generation section configured to compare levels of the first and second target voltages with levels of first and second internal voltages, and generate first and second comparison signals;
a latch code generation section configured to latch global codes and output first and second latch codes in response to the first and second comparison signals; and
a selection code generation section configured to generate first and second selection codes for adjusting levels of the first and second internal voltages using either the global codes or the first and second latch codes.

13. The semiconductor device of claim 12, wherein the global codes are up-counted or down-counted by one bit in a state in which the test mode enable signal has been enabled.

14. The semiconductor device of claim 12, wherein the upper limit voltage is set to a level higher than a level of the lower limit voltage, and the first and second target voltages are set to levels between the upper limit voltage and the lower limit voltage.

15. The semiconductor device of claim 12, wherein the target voltage generation section comprises:
a first resistive element configured to be coupled between the upper limit voltage and a first node where the first target voltage is outputted;
a second resistive element configured to be coupled between the first node and a second node where the second target voltage is outputted; and
a third resistive element configured to be coupled between the second node and the lower limit voltage.

16. The semiconductor device of claim 12, wherein the comparison signal generation section comprises:
a first comparison part configured to compare the level of the first target voltage with the level of the first internal voltage, and generate the first comparison signal; and
a second comparison part configured to compare the level of the second target voltage with the level of the second internal voltage, and generate the second comparison signal.

17. The semiconductor device of claim 12, wherein the latch code generation section comprises:
a first latch part configured to latch the global codes and output the first latch code in response to the first comparison signal; and
a second latch part configured to latch the global codes and output the second latch code in response to the second comparison signal.

18. The semiconductor device of claim 12, wherein the further comprising:
an internal voltage generation unit configured to generate the first internal voltage including a level, the level of the first internal voltage adjusted according to a level combination of the first selection code, and generate the second internal voltage including a level, the level of the second internal voltage adjusted according to a level combination of the second selection code.

19. The semiconductor device of claim 18, wherein the level of the first internal voltage increases when the first selection code is counted by one bit, and the level of the second internal voltage linearly increases when the second selection code is counted by one bit.

20. The semiconductor device of claim 18, wherein the level of the first internal voltage decreases when the first selection code is counted by one bit, and the level of the second internal voltage linearly decreases when the second selection code is counted by one bit.

* * * * *